United States Patent [19]
Cheng

[11] Patent Number: 5,898,568
[45] Date of Patent: Apr. 27, 1999

[54] EXTERNAL HEAT DISSIPATOR ACCESSORY FOR A NOTEBOOK COMPUTER

[76] Inventor: Chun-Cheng Cheng, 5th Fl., No. 6, Paokao Road, Hsintien City, Taiwan

[21] Appl. No.: 08/900,434

[22] Filed: Jul. 25, 1997

[51] Int. Cl.⁶ .................................................. H05K 7/20
[52] U.S. Cl. ........................ 361/695; 165/80.3; 165/122; 361/687; 415/203; 415/208.1
[58] Field of Search ........................... 165/80.3, 121–126, 165/185; 361/688, 687, 694–697, 715; 415/208, 208.1, 208.2, 208.3

[56] References Cited

U.S. PATENT DOCUMENTS

| | | | |
|---|---|---|---|
| 4,126,269 | 11/1978 | Bruger | 761/695 |
| 4,751,872 | 6/1988 | Lawson, Jr. | 361/695 |
| 5,171,183 | 12/1992 | Pollard et al. | 361/688 |

FOREIGN PATENT DOCUMENTS

| | | | |
|---|---|---|---|
| 6164175 | 6/1994 | Japan | 361/695 |

*Primary Examiner*—Gregory Thompson
*Attorney, Agent, or Firm*—William E. Pelton, Esq.

[57] ABSTRACT

A heat dissipator accessory for a notebook computer, which is concealed in an expansion slot of a notebook computer to effectively dissipate heat generated by the computer, is disclosed. The external heat dissipator for a notebook computer comprises a cooling module inserted into an expansion slot of the notebook computer. The cooling module includes a flat body having a connector electrically connected with a signal socket disposed in the expansion slot of the notebook, a cover disposed on the flat body and an air duct attached on the cover and mounted to the flat body. The flat body defines therein a chamber for receiving a fan and an air passage in communication with the chamber. The air passage has an air deflector transversely mounted at an end thereof for changing the direction of horizontal air flow. The cover defines a hole aligning with the fan chamber of the flat body and forming thereon a beveled portion corresponding to the air deflector. The beveled portion defines a plurality of openings for directing air from the flat body outside. The air duct defines therein a plurality of slits extending to an edge of the air duct and corresponding to the hole of the cover to allow air to be introduced to the chamber of the flat body via the hole of the cover.

6 Claims, 5 Drawing Sheets

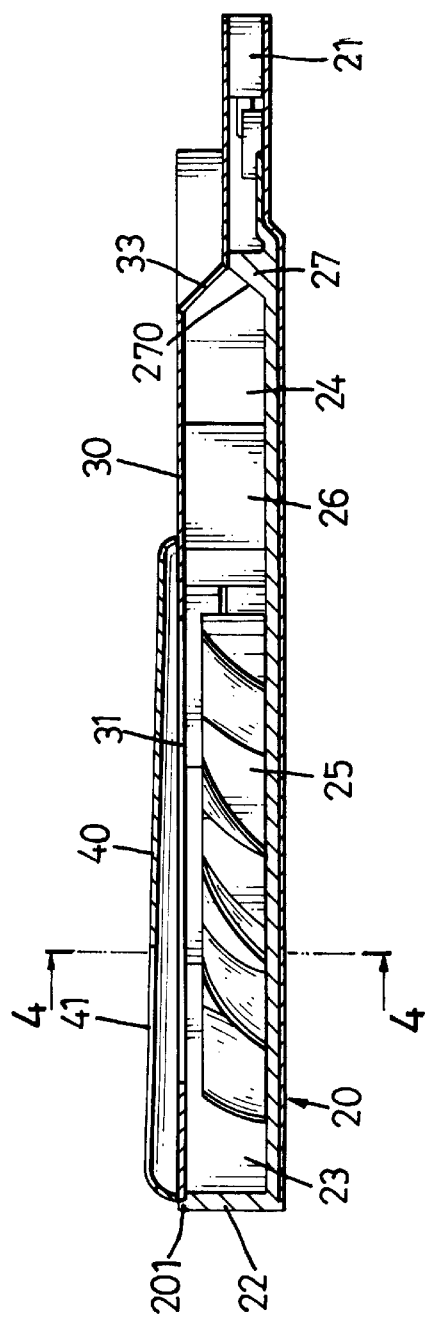
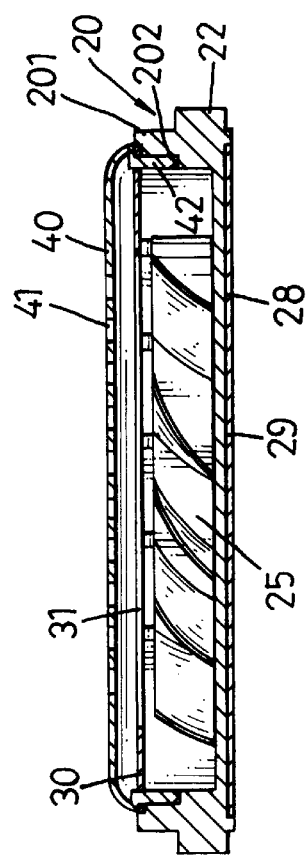
FIG. 3
FIG. 4

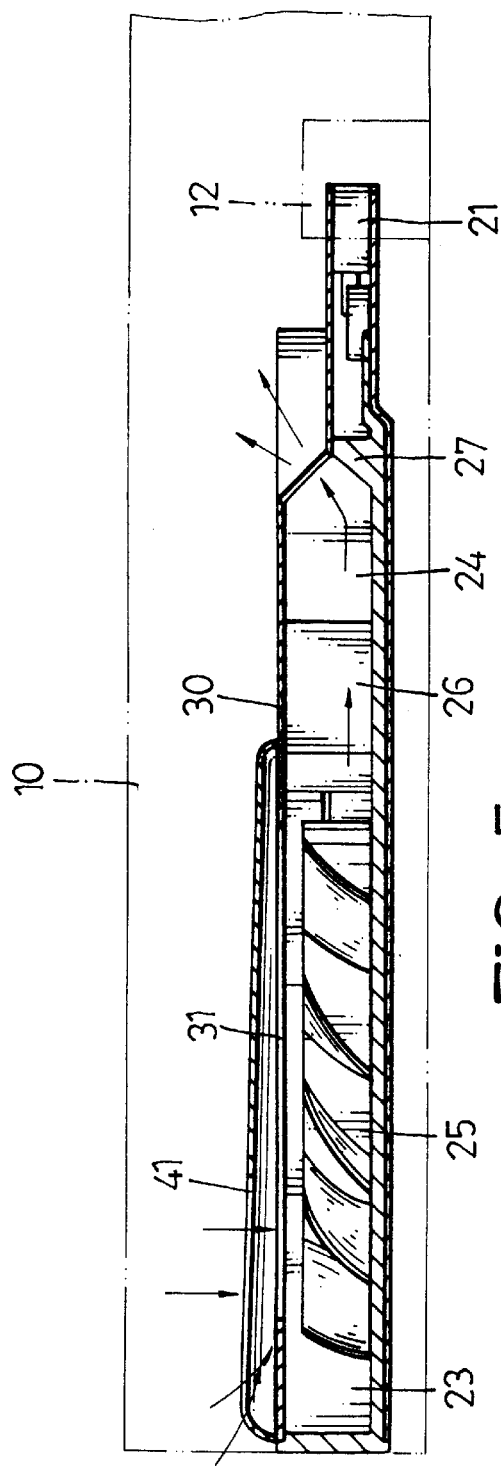
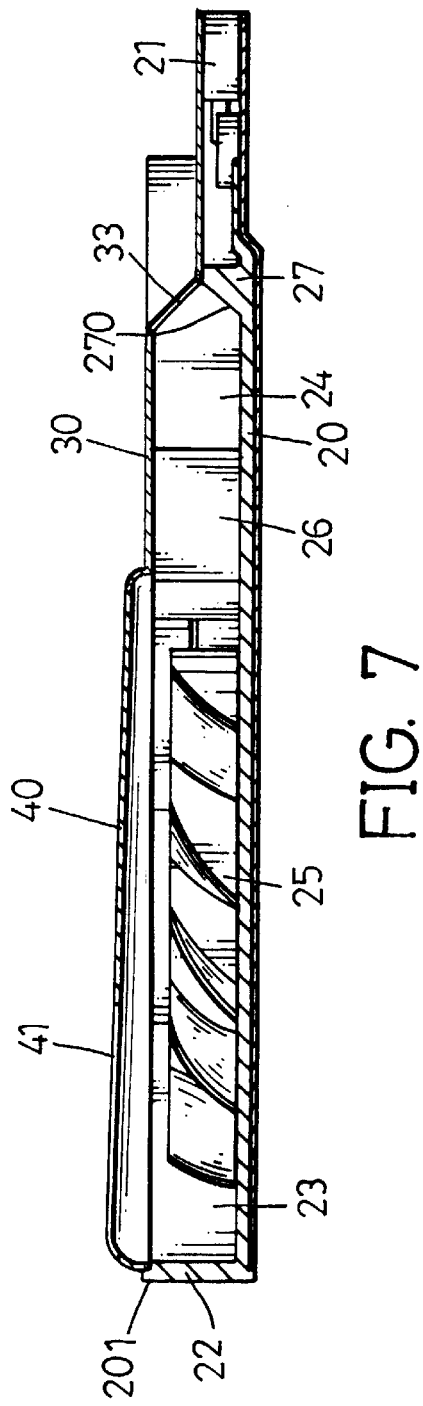
FIG. 5
FIG. 7

EXTERNAL HEAT DISSIPATOR ACCESSORY FOR A NOTEBOOK COMPUTER

BACKGROUND OF THE INVENTION

1. Field of the Invention

The present invention relates to an external heat dissipator accessory for a notebook computer, and more particularly to a heat dissipator accessary which is concealed in an expansion slot of a notebook computer to effectively dissipate heat generated by the computer.

2. Description of Related Art

In general, it is necessary to equip a CPU on a computer host with an individual heat-dissipating device, no matter what type the computer is, because the more rapid the CPU processes, the higher the operation temperature of the CPU is. However, other elements on the computer host other than the CPU also generate heat during operation. In a desktop personal computer, a large internal volume allows the heat generated by elements in the computer host to be naturally dissipated. However, in a portable notebook computer, the elements are compactly disposed. As a result, heat from the notebook computer can not be naturally dissipated well in such a little internal space. To ensure the computer can be operated at an appropriate temperature, it is necessary to develop a heat dissipator which can effectively dissipate heat generated by the notebook computer, without occupying significant internal space thereof.

The present invention provides an improved external heat dissipator for a notebook computer to mitigate and/or obviate the aforementioned problems.

SUMMARY OF THE INVENTION

An object of the present invention is to provide a heat dissipator which is concealed in an expansion slot of a notebook computer to effectively dissipating heat generated by the computer.

In accordance with one aspect of the present invention, the heat dissipator accessory for a notebook computer comprises a cooling module. The cooling module includes a flat body, a cover disposed on the flat body and an air duct attached on the cover and mounted to the flat body. The flat body defines therein a chamber for receiving a fan and an air passage in communication with the chamber. The air passage has an air deflector transversely mounted at an end thereof for changing the direction of horizontal air flow. The cover defines a hole aligning with the fan chamber of the flat body and forming thereon a beveled portion corresponding to the air deflector. The beveled portion defines a plurality of openings for directing air from the flat body outside. The air duct defines therein a plurality of slits extending to an edge of the air duct and corresponding to the hole of the cover to allow air to be introduced to the chamber of the flat body via the hole of the cover.

In accordance with another aspect of the present invention, the flat body forms a connector at one end thereof to electrically connect with a signal socket disposed in the expansion slot of the notebook computer.

In accordance with a further aspect of the present invention, the flat body further defines a circumferential flange and a pair of opposed recesses inside the circumferential flange, said cover defines a pair of cutouts at both sides thereof aligning with the opposed recesses of the flat body, and said air duct forms at both sides thereof a pair of ribs corresponding to the cutouts of the cover and received within the pair of recesses of the flat body when combined.

In accordance with astill a further aspect of the present invention, the flat body further has a plurality of longitudinal spaced boards disposed with the chamber and the air passage to direct the air from the chamber to the air passage.

In accordance with astill a further aspect of the present invention, the flat body further defines a shallow slot in an undersurface thereof for receiving a base plate and sealing wires connected to the flat body.

Other objects, advantages and novel features of the invention will become more apparent from the following detailed description when taken in conjunction with the accompanying drawings.

BRIEF DESCRIPTION OF THE DRAWINGS

The above and other objective, features and advantages of the present invention will be more clearly understood from the following detailed description taken in conjunction with the accompanying drawings, in which:

FIG. 3 is a sectional side view showing the heat dissipator accessory in accordance with a first embodiment of the present invention;

FIG. 4 is a sectional front view taken from line 4—4 of FIG. 3;

FIG. 5 is a sectional view showing the operation of the heat dissipator accessory in accordance with the first embodiment of the present invention;

FIG. 7 is a sectional side view showing the heat dissipator accessory in accordance with the second embodiment of the present invention.

DETAILED DESCRIPTION OF PREFERRED EMBODIMENT

Figure 1:
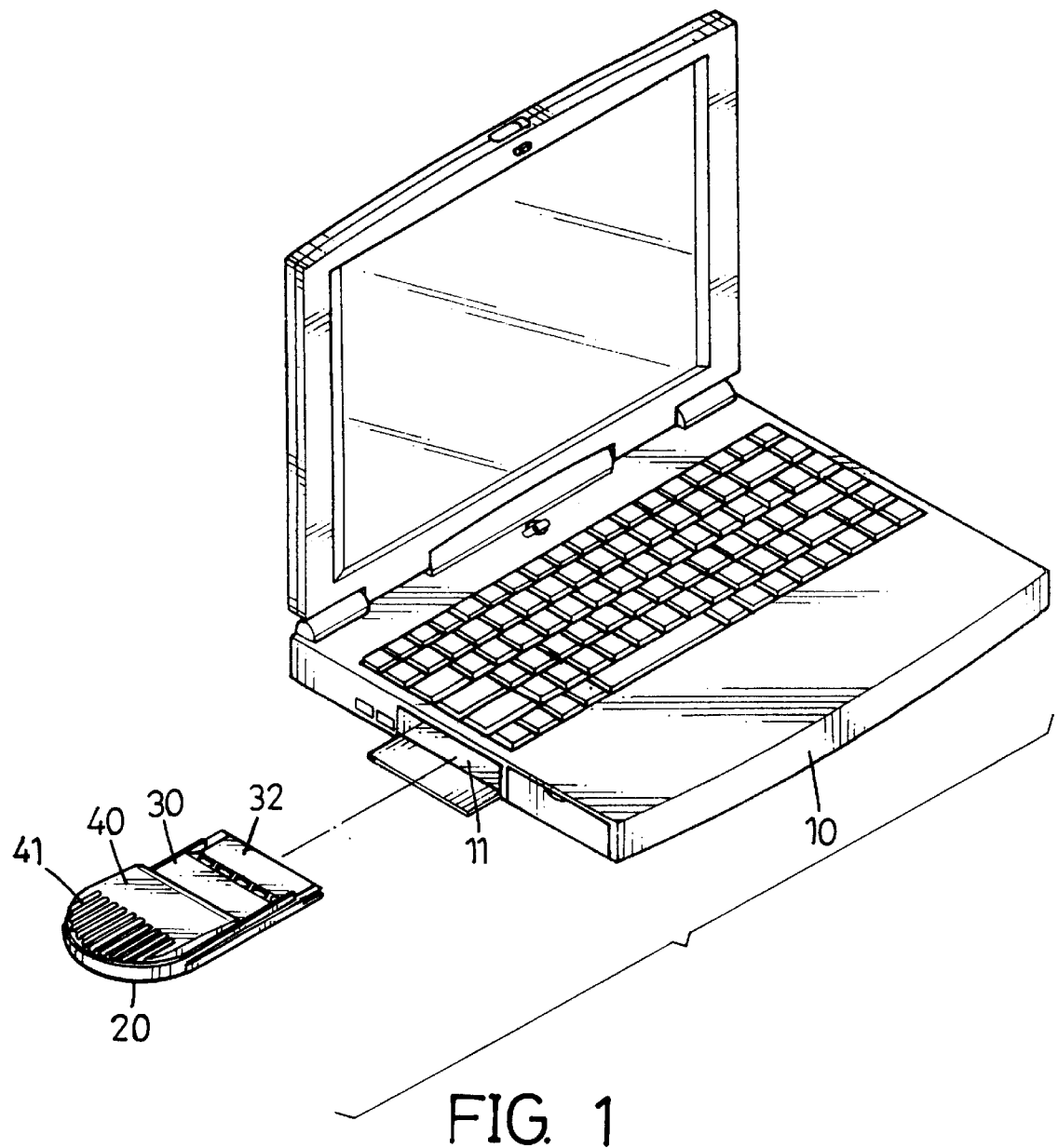
FIG. 1 is a perspective view showing a heat dissipator and a notebook computer for use therewith in accordance with the present invention.

Referring to FIG. 1, a heat dissipator accessory in accordance with the present invention comprises a cooling module 200 inserted into an expansion slot 11 pre-defined in a notebook computer 10. The usage of the cooling module 200 will not change the appearance of the notebook computer 10 nor increase its volume, but resolves the problem of heat dissipating of internal elements.

Figure 2:
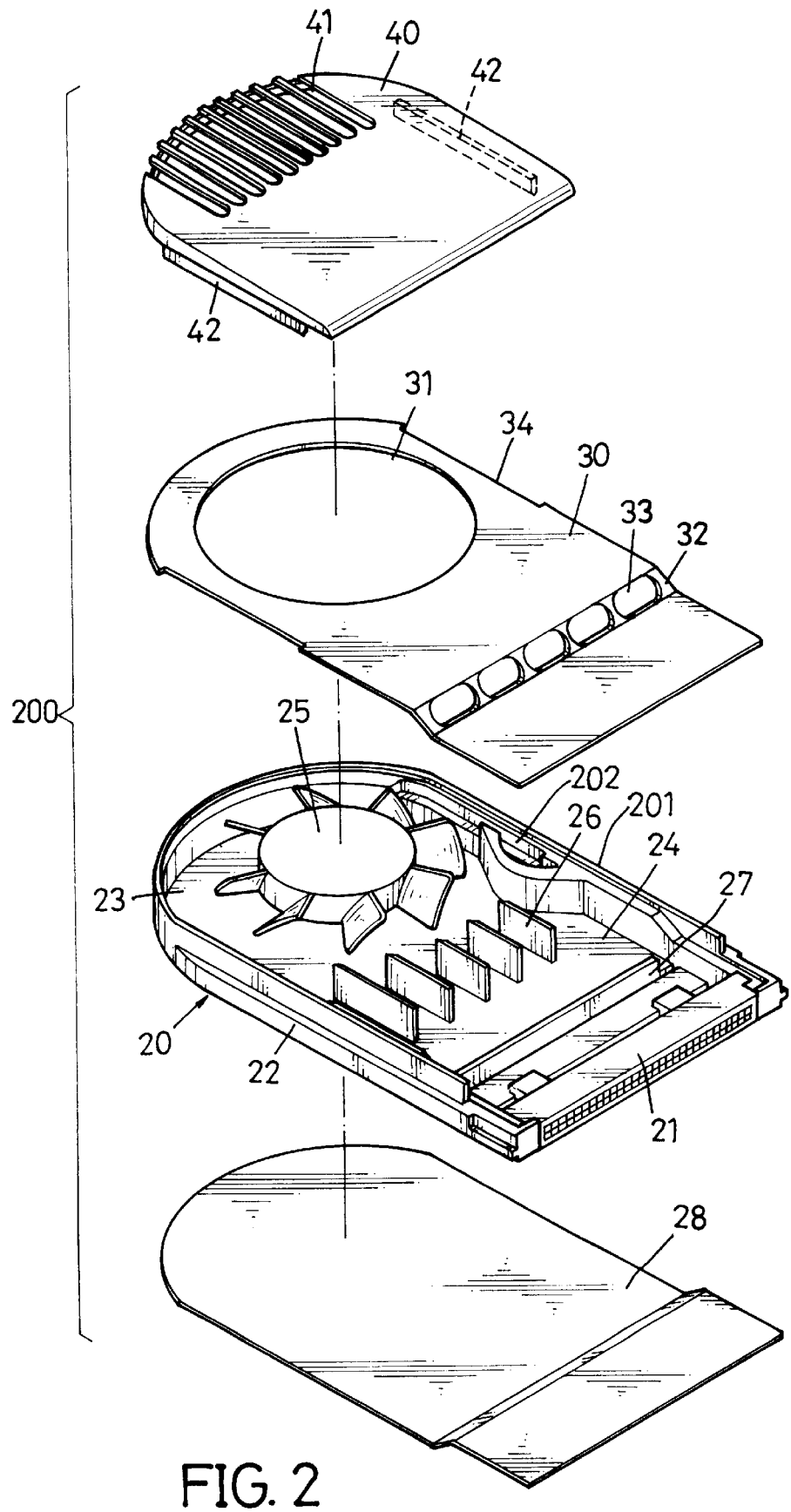
FIG. 2 is an exploded view showing the elements of the heat dissipator accessory for the notebook computer of FIG. 1.

With reference to FIG. 2, the cooling module 200 includes a flat body 20, a cover 30 and an air duct 40 mounted on the cover 30. The flat body 20 forms a connector 21 at one end thereof to electrically connect with a signal socket 12 (as shown in FIG. 4) disposed in the expansion slot 11 of the notebook computer 10, such that the cooling module 200 may function using the power from the notebook computer 10. A periphery of the cooling module 200 except where the connector 21 is provided forms a circumferential wall 22. The circumferential wall 22 defines therein a chamber 23 for receiving a fan 25 and an air passage 24 in communication with the chamber 23. In addition, a plurality of spaced boards 26 are disposed longitudinally within the chamber 23 and the air passage 24 for directing air from the chamber 23 to the air passage 24. An air deflector 27 is transversely mounted at an end of the air passage 24. The air deflector 27 forms an inclined and curved surface 270 for changing the direction of horizontal air flow, as shown in FIG. 3. The flat body 20 further defines a circumferential flange 201 on the circumferential wall 22 for gripping the cover 30 and a pair of opposed recesses 202 inside the flange 201 for engaging with the air duct 40.

Still referring to FIG. 2, the cover 30 is configured to mate with the flat body 20 and gripped by the circumferential flange 201 of the flat body 20. A hole 31 is defined in the cover 30 and aligns with the chamber 23 of the flat body 20 to allow the fan 25 to draw in air therefrom. A pair of cutouts 34 is defined at both sides of the cover 30 and aligned with the opposed recesses 202 of the flat body 20. The cover 30 also was formed thereon a beveled portion 32 corresponding to the air deflector 27. The beveled portion 32 of the cover 30 defines therein a plurality of openings 33 aligning with the inclined and curved surface 270 of the air deflector 27 to direct air from the flat body 20 outside.

The air duct 40 is attached on a distal end of the cover 30. The air duct 40 defines therein a plurality of slits 41 extending to an edge thereof and corresponding to the hole 31 of the cover 30, thereby allowing cool air to be introduced to the chamber 23 via the hole 31. In addition, the air duct 40 forms at both sides thereof a pair of ribs 42 corresponding to the cutouts 34 of the cover 30. Therefore, the ribs 42 are able to be received within the pair of recesses 202 of the flat body 20. Moreover, the flat body 20 defines a shallow slot 29 in an undersurface thereof (with reference to FIG. 4). A base plate 28 is received in the shallow slot 29 for enclosing wires (not shown) connected to the flat body 20 for supplying power to the fan.

It can be understood from the above mentioned description that the cooling module 200 is concealed in the expansion slot 11 of the notebook computer 10 (see FIG. 5), so that it will not increase the volume of the computer 10. Also, power supply for the operation of the fan 25 is provided by the connector 21 connected to the signal socket 12. When the notebook computer 10 is activated, the connector 21 supplies power to the fan 25 via the signal socket 12, then the fan 25 begins to introduce cool air from the slits 41 of the air duct 40 into the chamber 23. The cool air flow introduced by the fan 25 is then directed to the air passage 24 through the spaced boards 26. When the cool air flow reaches the air deflector 27, it will be guided by the inclined and curved surface 270 and sent to the openings 33 of the cover 30 to the interior of the computer 10. It is appreciated that the slits 41 are arranged to approach the edge of the cover 30, so that only cool air from outside will be introduced in, not the warm air from the interior of the notebook computer 10. Also, with the disposition of the openings 33, the cool air flow will be focused and strengthened. Therefore, an excellent heat dissipating effect can be obtained.

It is to be noted that the heat dissipation of the notebook computer 10 in the above mentioned embodiment is accomplished in a manner that the fan 25 introduces cool air from outside and transfers it to the interior of the notebook computer 10. Besides the manner of the first embodiment, the heat dissipation of the notebook computer 10 can be accomplished by the fan 25 forcibly exhausting warm air generated by the computer 10 and transferring it outside.

Figure 6:
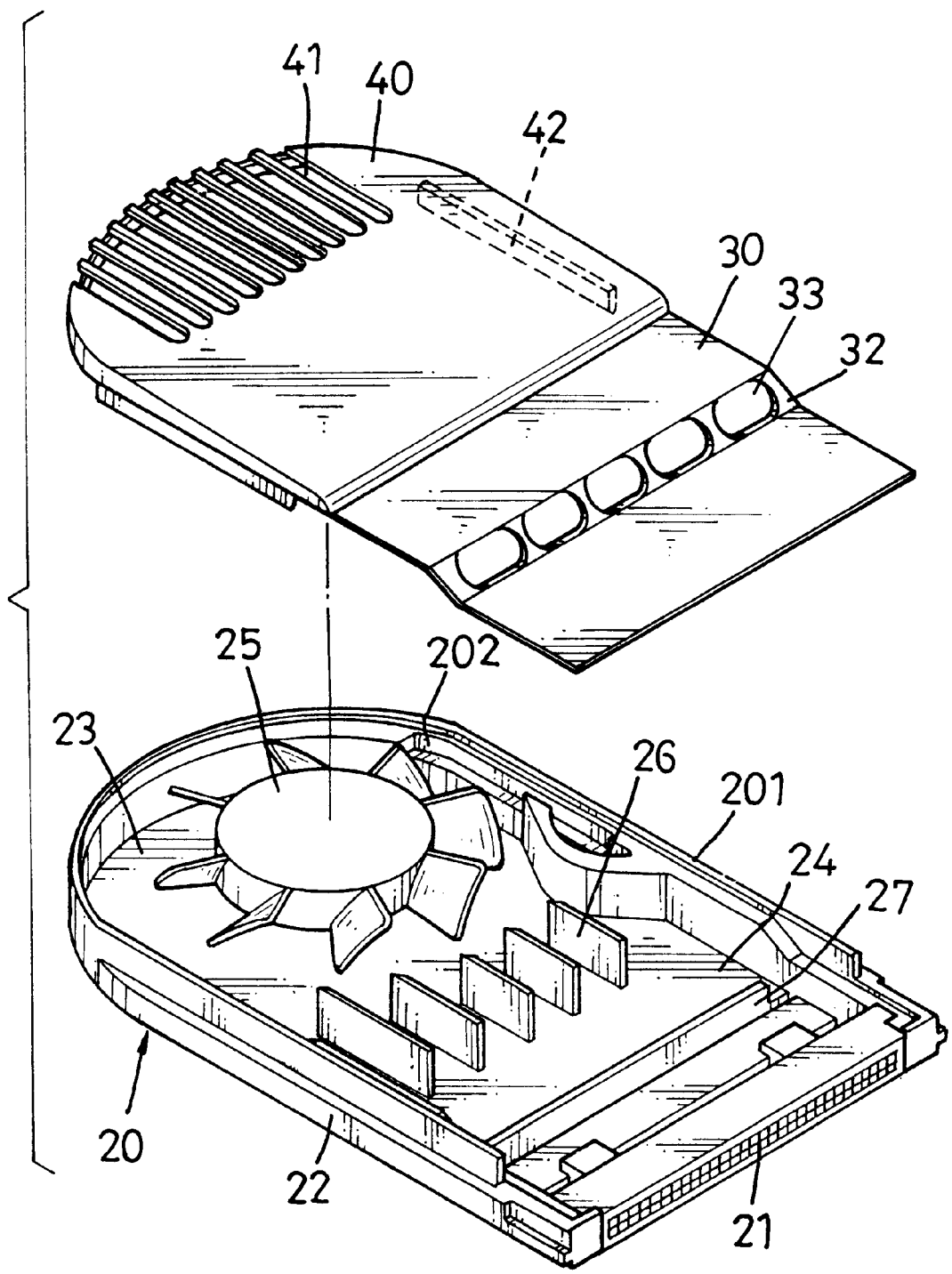
FIG. 6 is an exploded view showing the heat dissipator accessory in accordance with a second embodiment of the present invention.

Referring to FIG. 6 and FIG. 7, the external heat dissipator in accordance with a second embodiment of the present invention is shown. The second embodiment has a basic structure similar to that of the first embodiment, except the air duct 40 is integrally formed on the distal end of the cover 30 to simplify the structure. Moreover, the undersurface of the flat body 20 can be configured to have a wire casing (not shown) to receive wires, without providing the base plate 28. In this way, the elements constructing the external heat dissipator can be reduced and an overall structure can be simplified.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An external heat dissipator for a notebook computer comprising:
    a cooling module insertable into an expansion slot of the notebook computer, said cooling module including;
        a body defining therein a chamber for receiving a fan and an air passage in communication with the chamber, the air passage having an air deflector transversely mounted at an end thereof for changing the direction of air flow;
        a cover disposed on said body, said cover defining a hole adapted for alignment with the chamber of said body and having thereon a beveled portion corresponding to the air deflector, said beveled portion defining a plurality of openings for directing air to the outside of said body; and
        an air duct connected to said body and defining thereon a plurality of slits extending to an edge thereof in substantial alignment with the hole of said cover to allow air to enter said chamber.

2. An external heat dissipator for a notebook computer as claimed in claim 1, wherein said body has a connector at one end thereof to electrically connect with a signal socket disposed in the expansion slot of the notebook computer.

3. An external heat dissipator for a notebook computer as claimed in claim 1, wherein said body further defines a circumferential flange and a pair of opposed recesses inside the circumferential flange, said cover defining a cutout at each side thereof each of said cutouts aligning with one of said opposed recesses of said body, and said air duct having a pair of ribs each of which corresponds to one of said cutouts of the cover and receivable within one of said pair of recesses of said body.

4. An external heat dissipator for a notebook computer as claimed in claim 1, wherein said body further has a plurality of longitudinally spaced boards disposed with the chamber to direct air from the chamber to the air passage.

5. An external heat dissipator for a notebook computer as claimed in claim 1, wherein said air deflector has an inclined and curved surface corresponding to the beveled portion of the cover.

6. An external heat dissipator for a notebook computer as claimed in claim 1, wherein said body further defines a shallow slot in an undersurface thereof for receiving a base plate and enclosing wires connected thereto.

\* \* \* \* \*